United States Patent
Kang et al.

(10) Patent No.: US 7,288,487 B1
(45) Date of Patent: Oct. 30, 2007

(54) METAL/OXIDE ETCH AFTER POLISH TO PREVENT BRIDGING BETWEEN ADJACENT FEATURES OF A SEMICONDUCTOR STRUCTURE

(75) Inventors: Inkuk Kang, San Jose, CA (US); Hiroyuki Kinoshita, San Jose, CA (US); Calvin T. Gabriel, Cupertino, CA (US)

(73) Assignees: Spansion LLC, Sunnyvale, CA (US); Advanced Micro Devices, Inc, Austin, TX (US)

( * ) Notice: Subject to any disclaimer, the term of this patent is extended or adjusted under 35 U.S.C. 154(b) by 167 days.

(21) Appl. No.: 11/000,870

(22) Filed: Dec. 1, 2004

(51) Int. Cl.
 *H01L 21/302* (2006.01)
(52) U.S. Cl. .................. 438/723; 438/693
(58) Field of Classification Search ........... 438/689, 438/693, 706, 710, 714, 719, 720, 723, 724, 438/725
See application file for complete search history.

(56) References Cited

U.S. PATENT DOCUMENTS

| | | | | |
|---|---|---|---|---|
| 5,086,017 A | * | 2/1992 | Lu | 438/586 |
| 5,685,951 A | * | 11/1997 | Torek et al. | 438/396 |
| 5,773,360 A | * | 6/1998 | Chang et al. | 438/626 |
| 6,284,657 B1 | * | 9/2001 | Chooi et al. | 438/687 |
| 6,306,708 B1 | * | 10/2001 | Peng | 438/266 |
| 6,335,287 B1 | * | 1/2002 | Hwang et al. | 438/692 |
| 6,380,625 B2 | * | 4/2002 | Pramanick et al. | 257/751 |
| 6,465,345 B1 | * | 10/2002 | Nogami et al. | 438/631 |
| 6,489,240 B1 | * | 12/2002 | Iacoponi et al. | 438/687 |
| 6,566,242 B1 | * | 5/2003 | Adams et al. | 438/622 |
| 6,635,185 B2 | * | 10/2003 | Demmin et al. | 216/64 |
| 2003/0129850 A1 | * | 7/2003 | Olgado et al. | 438/745 |

* cited by examiner

*Primary Examiner*—Kin-Chan Chen
(74) *Attorney, Agent, or Firm*—Amin, Turocy & Calvin, LLP

(57) ABSTRACT

Methods for eliminating and/or mitigating bridging and/or leakage caused by the contamination of a dielectric layer with fragments and/or residues of a conductive material are disclosed. The methods involve exposing a semiconductor substrate with a dielectric layer contaminated with fragments and/or residues of conductive materials to one or more conductor and/or dielectric etches. The disclosure by eliminating and/or mitigating metal bridging and/or leakage can provide one or more of the following advantages: high device reliability, decreased manufacturing cost, more efficient metallization, and increased performance.

18 Claims, 5 Drawing Sheets

METAL/OXIDE ETCH AFTER POLISH TO PREVENT BRIDGING BETWEEN ADJACENT FEATURES OF A SEMICONDUCTOR STRUCTURE

TECHNICAL FIELD

The subject invention generally relates to semiconductor fabrication techniques and more particularly, to methods for mitigating and/or preventing bridging and/or leakage between adjacent features of a semiconductor structure.

BACKGROUND ART

In the semiconductor industry, there is a continuing trend toward higher device densities. To achieve these high densities there have been, and continue to be, efforts toward scaling down device dimensions (e.g., at sub-micron levels) on semiconductor wafers. In order to accomplish such high device packing densities, smaller and smaller feature sizes are required. This includes the width and spacing of interconnecting lines, spacing and diameter of contact holes, and the surface geometry, such as corners and edges, of various features. The dimensions of and between such small features can be referred to as critical dimensions. With an ever increasing number of integrated circuit features being formed on a circuit die, the importance of properly designing patterns to form structures that are isolated and non-interfering with one another has also increased.

Conventional semiconductor devices typically comprise a semiconductor substrate and a plurality of dielectric and conductive layers formed thereon. An integrated circuit contains numerous microelectronic devices, such as metal oxide semiconductor field effect transistors (MOSFETs), a plurality of conductive patterns comprising conductive lines separated by interwiring spacings, and a plurality of interconnect lines, such as bus lines, bit lines, word lines and logic interconnect lines. Such interconnection lines, made of metal interconnect materials, generally constitute a limiting factor in terms of size (width) and various functional characteristics of the integrated circuit.

With the increase in metal levels and line length, and the corresponding decreases in line width, there is a need in the art for systems and methods that improve critical dimensions and electrical performance of interconnect structures and conductive patterns.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention provides for efficient methods of metallization. In particular, the subject invention provides methods that can eliminate and/or mitigate bridging and/or leakage between adjacent features of a semiconductor structure. The methods involve exposing a semiconducting substrate undergoing fabrication to one or more of conductor and/or dielectric etches following polishing of a conductive material deposited in an opening. The subject invention by eliminating and/or mitigating bridging and/or leakage between adjacent features of semiconductor structures provides one or more of the following advantages: high device reliability, decreased manufacturing cost, more efficient metallization, and increased performance.

According to one aspect of the subject invention, methods are provided which can eliminate and/or mitigate bridging and/or leakage between adjacent features resulting from the contamination of a dielectric layer with fragments and/or residues of conductive materials. The methods involve forming one or more openings in/or adjacent to a dielectric layer formed over a semiconductor substrate, depositing a conductive material over the semiconductor substrate and into one or more of the openings, polishing the conductive material whereby fragments and/or residues of the conductive material contaminate the dielectric layer, and exposing the semiconductor substrate containing the dielectric layer contaminated with fragments and/or residues of the conductive material to one or more conductor and/or dielectric etches to remove substantially all the fragments and/or residues of the conductive material from the surface of the dielectric layer.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

Figure 1:
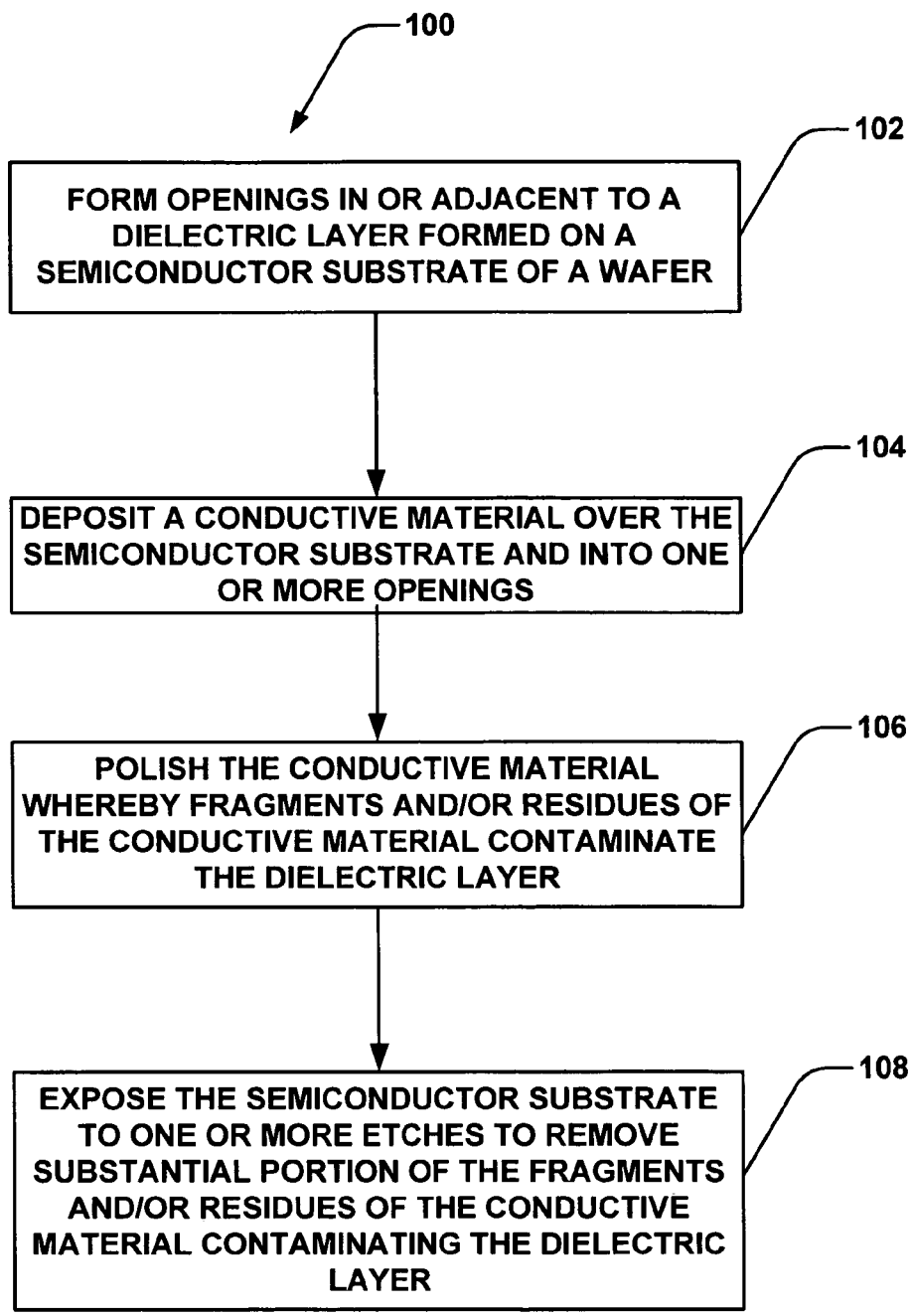
FIG. 1 is a flow chart of an exemplary methodology 100 for eliminating and/or mitigating bridging and/or leakage between adjacent features according to one aspect of the subject invention.

The subject invention relates to metallization procedures to form interconnect structures and conductive patterns for semiconductor devices. More particularly, the subject invention provides methods that can eliminate and/or mitigate bridging and/or leakage between adjacent features of a semiconductor substrate/device caused by the contamination of a dielectric layer with fragments and/or residues of conductive materials. The methods involve exposing a semiconductor substrate containing a dielectric layer contaminated with fragments and/or residues of conductive materials to one or more etches. The etches can be conductor and/or dielectric etches. The subject invention by eliminating and/or mitigating metal bridging and/or leakage between adjacent features can provide for more efficient metallization patterns and interconnects during fabrication of semiconductor devices.

The inventors of the subject invention have discovered that exposing a semiconductor substrate containing a dielectric layer contaminated with fragments and/or residues of conductive materials to one or more of conductor and/or dielectric etches can substantially remove fragments and/or residues of conductive materials from the surfaces of a dielectric layer without significantly altering the properties of the uncontaminated portion of the dielectric layer and/or conductive material layer. If the fragments and/or residues remain in or on the surface of a dielectric layer, the fragments and/or residues can cause undesirable defects such as metal bridging and/or leakage between adjacent features, such as conductive patterns and interconnect structures. Polishing procedures can generate fragments of conductive material, and some of these fragments can become embedded in and/or adhere to the surfaces of a dielectric layer adjacent to the opening. Additionally, polishing procedures can also leave behind residues of the conductive material. Some residues are left behind in scratches formed on dielectric surface during polishing. Some residues are left behind from incomplete polishing. Polishing processes are often employed during fabrication of interconnect structures where conductive materials are deposited within openings formed in a dielectric layer, and polished back to planarize or leave the conductive material substantially within the openings. Bridging may result from the inability of a dielectric layer to completely separate one or more electrically active regions on a semiconductor substrate. A contaminated dielectric layer may also cause losses in the insulation properties of a dielectric layer, thereby, resulting in short circuits or leakage. Both bridging and leakage affect the performance of interconnect structures and conductive patterns.

The subject invention can be used advantageously in the fabrication of various interconnect structures and conductive patterns, such as metal lines, damascene structures, dual damascene structures, metal plugs, wirings, and the like.

Typically, methods of the subject invention start with deposition of a conductive material into an opening formed in or adjacent to a dielectric layer overlying a semiconductor substrate. The conductive material is then polished to planarize the surface and/or to remove the conductive material from upper surfaces of the dielectric layer using techniques such as chemical mechanical polishing. The polishing creates fragments and/or residues of conductive material that contaminate the dielectric layer (generally contaminate the top surface of the dielectric material). Additionally, polishing procedures can also leave behind residues of the conductive material. The semiconductor substrate containing the dielectric layer contaminated with fragments and/or residues of the conductive material is then exposed to one or more conductor and/or dielectric etches to substantially remove the fragments and/or residues of the conductive material embedded in the dielectric layer along with a small portion of uncontaminated dielectric layer.

The semiconductor substrate for the subject invention can be any suitable substrate. The conductive material of the subject invention can be deposited over the semiconductor substrate and into openings such as vias, contacts, metal lines, trenches, grooves, and the like. The conductive materials of the subject invention can be metals, metal alloys, conductive compounds, and the like. The dielectric layers of the subject invention can be formed using any suitable dielectric material. For example, the dielectrics can be inorganic materials, organic materials, or composites of both organic and inorganic materials.

The subject invention can be carried out using one or more etches, such as conductor etches, dielectric etches, conductor/dielectric etches, and the like. Conductor etches serve to remove fragments and/or residues of conductive materials contaminating a dielectric layer, whereas dielectric etches serve to remove predominantly a portion of a dielectric layer contaminated with fragments and/or residues of conductive materials. The conductor etch of the subject invention can be any suitable etch, for example, a metal etch. Similarly, the dielectric etch of the subject invention can be any suitable etch, for example, an oxide etch.

Etches of the subject invention can be either wet or dry etches. Dry etches include plasma etches, reactive ion etches, and the like. Etches can be either blanket etches or selective etches. In one embodiment of the subject invention, the etches can be blanket etches, wherein a semiconductor substrate containing a dielectric layer contaminated with fragments of conductive materials is exposed to etching. In another embodiment of the subject invention, selected portions of a semiconductor substrate containing a dielectric layer contaminated with fragments of conductive materials are exposed to one or more selective etches.

The sequence of etches can vary depending on particular design needs. In one embodiment of the subject invention, both conductor and metal etches can be performed simultaneously. In another embodiment of the subject invention, the sequence in which conductor and metal etches are carried out can be varied.

The etching environment and etching chemistry is selected such that the etches substantially remove only the contaminated portion of a dielectric layer without significantly removing either the uncontaminated portion of a dielectric layer or conductive materials in the openings. In one embodiment the subject invention, the etches can have a dielectric material-to-conductive material selectivity from about 50:1 to about 1:50. In another embodiment the subject invention, the etches can have a dielectric material-to-conductive material selectivity from about 10:1 to about 1:10.

Etching time can be controlled to achieve selective removal of only the contaminated portion of a dielectric layer. In one embodiment of the subject invention, etch time is from about 1 second to about 200 seconds. In another embodiment of the subject invention, etch time can be from about 10 seconds to about 100 seconds. In yet another embodiment of the subject invention, etch time can be about 30 seconds. In yet one more embodiment of the subject invention, the etching is performed until an end point is reached. Suitable detection systems can be used to determine the proper end point for etching. End point detection systems can include optical detection, electrical detection, chemical detection, and the like.

Etch rate of the subject invention is controlled to reduce any unwanted over etching. In one embodiment of the subject invention, the etch rate can be from about 1 Å per minute to about 250 Å per minute. In another embodiment of the subject invention, the etch rate can be from about 10 Å per minute to about 100 Å per minute. In yet another embodiment, the etch rate is adjusted such that only the desired level of the contaminated portion of a dielectric layer is removed without any over etching of other layers.

The metal etches of the subject invention can be carried out using any suitable method. Metal etching can be by a wet etch or a dry etch. Dry etching may include plasma etching, reactive ion etching (RIE), and the like. Metal etch reaction can involve any suitable etch chemistry. In some instances, prior to metal etching, contaminated dielectric layer can be subjected to an oxidation reaction.

The oxide etches of the subject invention can be carried out using any suitable etchants. The oxide etches can be wet or dry etches. For example, wet oxide etching can be carried out in solutions containing buffered, or diluted hydrofluoric acid (HF). HF can etch oxide in a very controlled manner and yet still be very selective. Typical concentrations of HF vary from about 5:1 to about 100:1. An example of dry oxide etching is plasma-based processing using fluorocarbon gases such as $CF_4$, $C_2F_6$, $CHF_3$, or $C_4F_8$, possibly with additives such as $O_2$, $N_2$, Ar, or He. The wet or dry oxide etches of the subject invention may be performed in batch or single wafer platforms.

The subject invention may be understood and its advantages appreciated in conjunction with figures and drawings, wherein like numerals represent like features throughout. It is to be understood that the description of these embodiments are merely illustrative and they should not be taken in a limiting sense. The embodiments of an apparatus or method of the subject invention described herein can be manufactured in a number of different positions and orientations.

The term "opening" in context of the subject invention refers to vias, metal lines, trenches, contact holes, and the like. The term "wafer" refers to a semiconductor structure, substrate, or device during any stage of fabrication. The "dielectric" in context of the subject invention can be either an interlayer dielectric (ILD) or an intermetal dielectric (IMD). The "adjacent features" of the subject invention include any active or passive elements of a semiconductor structure that are separated by a dielectric layer. Examples include polysilicon gates, wordlines, source regions, drain regions, bit lines, bases, emitters, collectors, conductive lines, conductive plugs, and the like.

Referring to FIG. 1, a flow diagram of an exemplary method 100 for eliminating and/or mitigating bridging and/or leakage between adjacent features of a semiconductor structure according to one aspect of the subject invention is illustrated. For simplicity of explanation, the methodology is depicted and described as a series of acts. It is to be understood and appreciated that the subject invention is not limited by the acts illustrated and/or by the order of acts, for example acts can occur in various orders and/or concurrently, and with other acts not presented and described herein. Furthermore, not all illustrated acts may be required to implement the methodologies in accordance with the subject invention. In addition, those skilled in the art will understand and appreciate that the methodologies could alternatively be represented as a series of interrelated states via a state diagram or events.

The exemplary methodology 100 can be used to fabricate a damascene interconnect, and involves forming one or more openings in a dielectric layer formed over a semiconductor substrate (act 102), depositing a conductive material over the semiconductor substrate and into the openings (act 104), polishing the conductive material whereby fragments and/or residues of the conductive material contaminate the dielectric layer (act 106), and exposing the semiconductor substrate to one or more etches to remove a substantial portion of the fragments and/or residues of the conductive material contaminating the dielectric layer (act 108).

Figure 2:
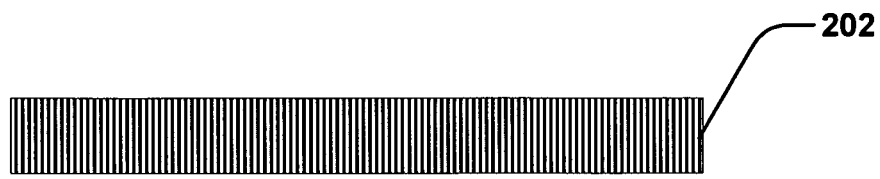
FIGS. 2-7 are cross sectional illustrations showing a semiconductor substrate undergoing various stages of fabrication according to method 100.

The semiconductor substrate over which a dielectric layer is formed can be any substrate used in the course of semiconductor processing or any semiconductor surface. FIG. 2 is a cross sectional illustration of a semiconductor substrate 202 used for carrying out the subject invention. The substrate is formed using methods known to persons skilled in the art. Examples of substrates for the subject invention include semiconductor materials such as gallium arsenide (GaAs), germanium, silicon, silicon germanium, lithium niobate, and compositions containing silicon such as crystalline silicon, polysilicon, amorphous silicon, epitaxial silicon, silicon dioxide ($SiO_2$), and combinations thereof. Typically, the substrate is a silicon substrate, optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc.

Figure 3:

In one embodiment of the subject invention, a dielectric can be deposited over a metal line formed on a substrate. The metal line can contain any conductive material. For example, the metal line can contain copper, copper alloys, aluminum, tungsten, titanium, nickel, and the like. Optionally, prior to depositing the dielectric layer additional layers such as etch stop layers, barrier layers, capping layers, or patterned hard mask layers may be formed over the metal line using methods and materials known in the art. FIG. 3 is a cross sectional illustration of a dielectric layer 303 formed on the semiconductor substrate 202.

Any dielectric material can be used. Both organic and inorganic dielectric materials may be used. Similarly, both low and high k dielectrics may be used. Also polymeric, amorphous, crystalline and monomeric materials can be used as dielectric materials for this invention. Examples of dielectric materials include silicon containing spin-on glass such as alkoxysilane polymer, a siloxane polymer, a silsesquioxane polymer, a poly(arylene ether), a fluorinated poly (arylene ether), other polymer dielectrics, nanoporous silica or mixtures thereof. In one embodiment of the subject invention, oxides of silicon such as silicon dioxide can be used as the dielectric layer. In another embodiment, one or more of silicon oxynitride, silicon carbide, and silicon nitride can be used as the dielectric layer.

The dielectric layer can be formed by any suitable technique. For example, chemical vapor deposition (CVD), plasma enhanced chemical vapor deposition (PECVD), low pressure chemical vapor deposition (LPCVD), high pressure chemical vapor deposition (HPCVD) methods can be used. Polymeric dielectrics can also be formed by using spin-coating, dip-coating, spraying, or roller coating.

The dielectric layer is deposited to a thickness appropriate to facilitate formation of openings and subsequent fabrication procedures. Typically, dielectrics are deposited to a thickness from about 800 Å to about 50,000 Å.

Figure 4:
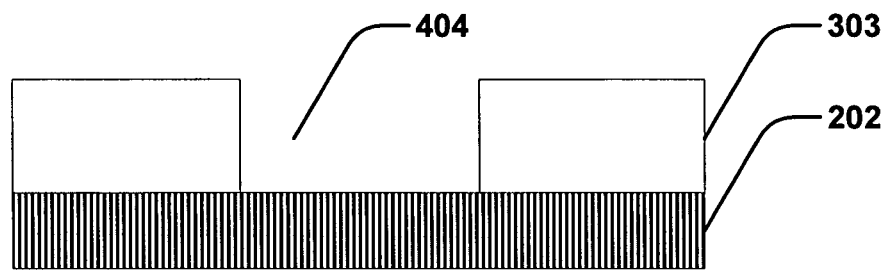

One or more openings are formed in the dielectric layer 303. In one embodiment of the subject invention the openings are vias. In another embodiment of the subject invention, the openings are contacts. FIG. 4 shows a cross sectional illustration of an opening 404 formed in the dielectric layer 303. Standard lithographic techniques can be used to form the opening 404. The vias or contacts can have relatively vertical sidewalls that extend perpendicular to the topological surface of the dielectric layer.

Optionally, a barrier layer may be formed surrounding the bottom and sidewalls of the opening 404. The barrier layer may help in preventing diffusion of conductive materials into surrounding layers. Any barrier metal can be used for forming the barrier layer. For example, tantalum, tantalum nitride, tungsten, tungsten nitride, titanium, titanium nitride and combinations thereof can be used to form the barrier layer. In one embodiment of the subject invention, the barrier layer contains tantalum. In another embodiment of the subject invention, the barrier layer includes compounds and alloys of tantalum. Examples include Ta nitride, Ta oxide, Ta sulfide, Ta carbide, TaW, TaTi, and the like.

The barrier layer may be formed using suitable deposition techniques such as CVD, physical vapor deposition (PVD), PECVD, LPCVD, HPCVD, sputtering, spin-coating, and the like can be used.

The thickness of the barrier layer can be adjusted to desirable levels. The thickness of the barrier layer can range from about 0.1 nm to about 100 nm. Optionally, the barrier layer can be polished to planarize the surface. Polishing can be done by any suitable technique.

Figure 5:
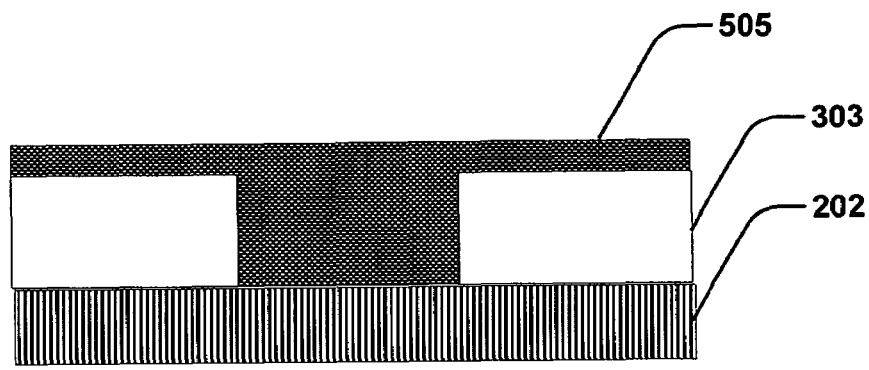

Referring back to FIG. 1, act 104 is depositing a conductive material over the semiconductor substrate and into the opening 404. Typically, the conductive material is filled in such a way that the conductive material covers the surface of the dielectric layer 303. FIG. 5 shows a cross sectional illustration of an opening filled with conductive material 505. The conductive material can be any suitable material; such as a conductive metal, conductive metal alloys, conductive metal oxides, conductive polymer films, semiconductive materials, and the like. Specific examples of conductive materials include one or more of aluminum, chromium, copper, germanium, gold, magnesium, manganese, indium, iron, nickel, palladium, platinum, silver, titanium, tungsten, zinc, and alloys thereof. In one embodiment of the subject invention, the conductive material includes at least copper. In another embodiment of the subject invention, the conductive material includes at least tungsten. In yet another embodiment of the subject invention the conductive metal can include at least aluminum.

Techniques for filling openings with conductive materials are known to persons skilled in the art. For example, electroplating, electroless filling, sputtering, evaporation, deposition, and the like can be used to fill the opening 404 with conductive materials.

In one example, where the conductive material is copper, the filling may include formation of a Cu seed layer. Once the Cu seed layer is formed the remainder of the Cu filling is completed using techniques such as evaporation, CVD, electroplating, electroless plating and the like. Optionally, the Cu seed layer may undergo a thermal annealing.

Act 106 of method 100 is polishing the conductive material 505 to substantially planarize the surface of the metal, and to confine the conductive material substantially to the via openings. Polishing can be performed using any suitable method. For example, chemical, mechanical, or chemical mechanical polishing (CMP) can be used. Polishing techniques are known to persons skilled in the art. In one embodiment of the subject invention, CMP can be used to polish the conductive material. Typically, CMP utilizes polishing slurry containing an abrasive and a chemically active component. In metal CMP processes, slurries help to form soft abradable metal oxides that can be removed by the mechanical action of the abrasives in the slurry. CMP slurry is selected such that the slurry exhibits significantly different removal rates for at least two different materials. The chemical components in selected slurries may include hydrogen peroxide or hydrogen peroxide/ammonium hydrogen peroxide. The polishing rate is controlled and typically varies from about 100 Å about 10,000 Å per minute. CMP equipment and slurry materials are commercially available.

Figure 6:
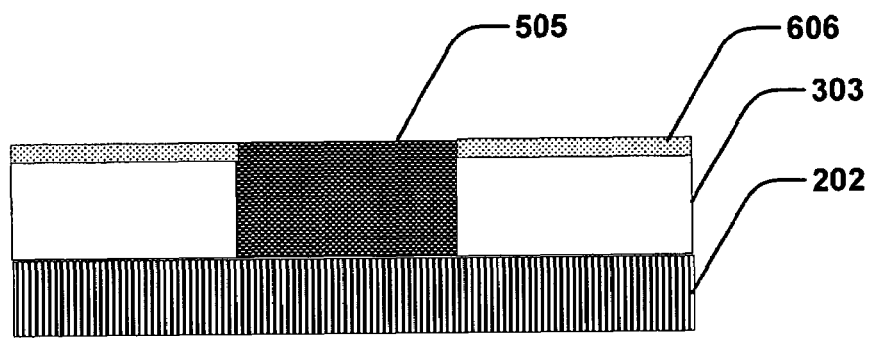

The conductive material can be polished such that the conductive material substantially remains in the opening. The polishing may also remove any etch stop layers, capping layers, barrier layers, or hard mask layers formed on the surface of the dielectric layer. Optionally, cleaning or washing of the semiconductor substrate may be carried out after polishing the conductive material. The polishing of the conductive material may generate fragments of different sizes due to mechanical and chemical reactions occurring on the surface of the wafer. Additionally, the dielectric surface may also contain residues of the conductive material that have been left behind in scratches formed on dielectric surface during polishing or from incomplete polishing. Some of these fragments and/or residues may either become embedded in the dielectric layer or adhere to the top surface of the dielectric layer. FIG. 6 is a cross sectional illustration showing contaminated surfaces 606 of the dielectric layer 303.

Referring back to FIG. 1, act 108 of method 100 is exposing the semiconductor substrate containing dielectric material contaminated with fragments and/or residues of conductive materials to one or more etches. The etches of the subject invention are described earlier and can be blanket or selective etches. The etches can be conductor etches, dielectric etches, and conductor/dielectric etches. Example of conductor etches include metal etches and the like. Examples of the dielectric etches include oxide etches and the like. In one embodiment of the subject invention, the semiconductor substrate containing the contaminated dielectric layer with the fragments and/or residues of the conductive material is first exposed to a metal etch then to an oxide etch. In another embodiment of the subject invention, the semiconductor substrate containing the contaminated dielectric layer with the fragments and/or residues of the conductive material is exposed first to an oxide etch and then to a metal etch. In yet another embodiment of the subject invention, the semiconductor substrate containing the contaminated dielectric layer with the fragments and/or residues of the conductive material is exposed to conditions such that both metal and oxide are etched contemporaneously. In one other embodiment of the subject invention, either a metal etch or an oxide etch are omitted. In yet a further embodiment the semiconductor substrate containing the contaminated dielectric layer with the fragments and/or residues of the conductive material is exposed to a plurality of etches selected from metal and oxide etches.

Etches can be carried out using any commercially available etch apparatus. For example, plasma etchers manufactured by Lam Research Corporation, USA, can be used. Etches can be carried out either in batches or in singles.

An oxide etch can be carried out using a suitable chemistry and etchants. In one embodiment of the subject invention, a combination of $NH_4F$ and HF can be used as etchants. In another embodiment of the subject invention, fluorocarbon based etchants such as $CF_4$ and $CHF_3$ can be used. In another embodiment of the subject invention, $N_2$, $O_2$, Ar, or CO (or any other noble gas) can be added to etchant gases. In yet another embodiment of the subject invention, fluorine based etchants $NF_3$ or $SF_6$ can be used.

A metal etch can be carried out using a suitable etchant chemistry and etchants. For example, any Cl-based gas such as $Cl_2$, $BCl_3$, or HCl can be used as metal etchants. In another example, Br-based etchants such as HBr can be used. Additives such as $N_2$, $O_2$, Ar, He, or any other noble gas can be included. In yet another embodiment, combinations of Cl- and Br-based gases such as HCl and HBr, or combinations of Cl- and F-based gases such as $Cl_2$ and $CF_4$ can be used.

Figure 7:
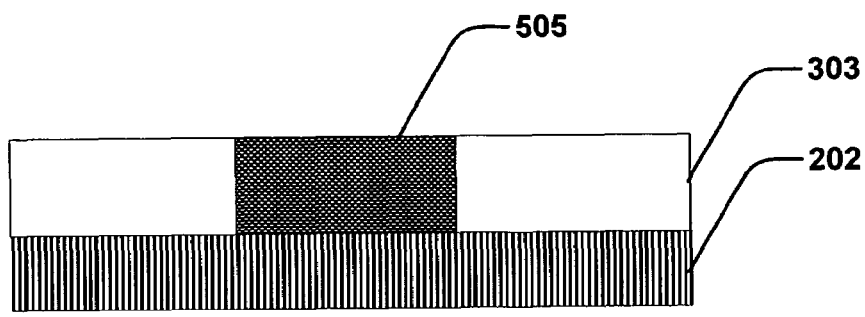

Etch parameters are adjusted in such a way that only contaminated portions of the dielectric layer is removed with minimal over etch of other layers. FIG. 7 is a cross sectional illustration of a semiconductor substrate showing a semiconductor substrate after etching.

In one example, an etch according to the subject invention may include a plasma etch involving loading wafers into an etching chamber, adjusting chamber vacuum conditions, setting electrode temperature and chamber temperature, introducing gases, and adjusting RF power. Gases are introduced at a suitable flow rate depending on etchant chemistry and needs of the etch. Typical gas flow rates are from about 1 standard cubic centimeter per minute to about 200 standard cubic centimeters per minute. Typical RF power can range from about 50 W to about 2000 W. The temperature of the chamber and electrodes can be from about 10° C. to about 100° C. Gas pressures can vary from about 1 mTorr to about 1000 mTorr.

Optionally, the wafers can be washed or cleaned after etching to remove etchants and other materials using known methods and materials. The structure obtained from carrying out method 100 of the subject invention can be used to form additional layers or levels to complete the fabrication of a desired structure or device.

The method 100, thus, can advantageously provide metal interconnect structures in which bridging and/or leakage due to contamination of a dielectric layer are eliminated and/or mitigated. Although the subject invention is described using a damascene type of interconnect structure fabricated according to one conventional method, persons skilled in the art appreciate that damascene structures can be formed by following different procedures. The subject invention can be advantageously applied to damascene structures formed using any of the procedures.

According to another aspect of the subject invention, a method is provided to eliminate and/or mitigate bridging and/or leakage of conductive materials into adjacent features during fabrication of a dual damascene structure. In a dual damascene process two interconnect layers are formed at once. For example, a layer of conductive vias and an overlying layer of conductive wiring can be formed simultaneously. The subject invention can be used to improve the performance and reliability of dual damascene interconnect structures.

Figure 8:
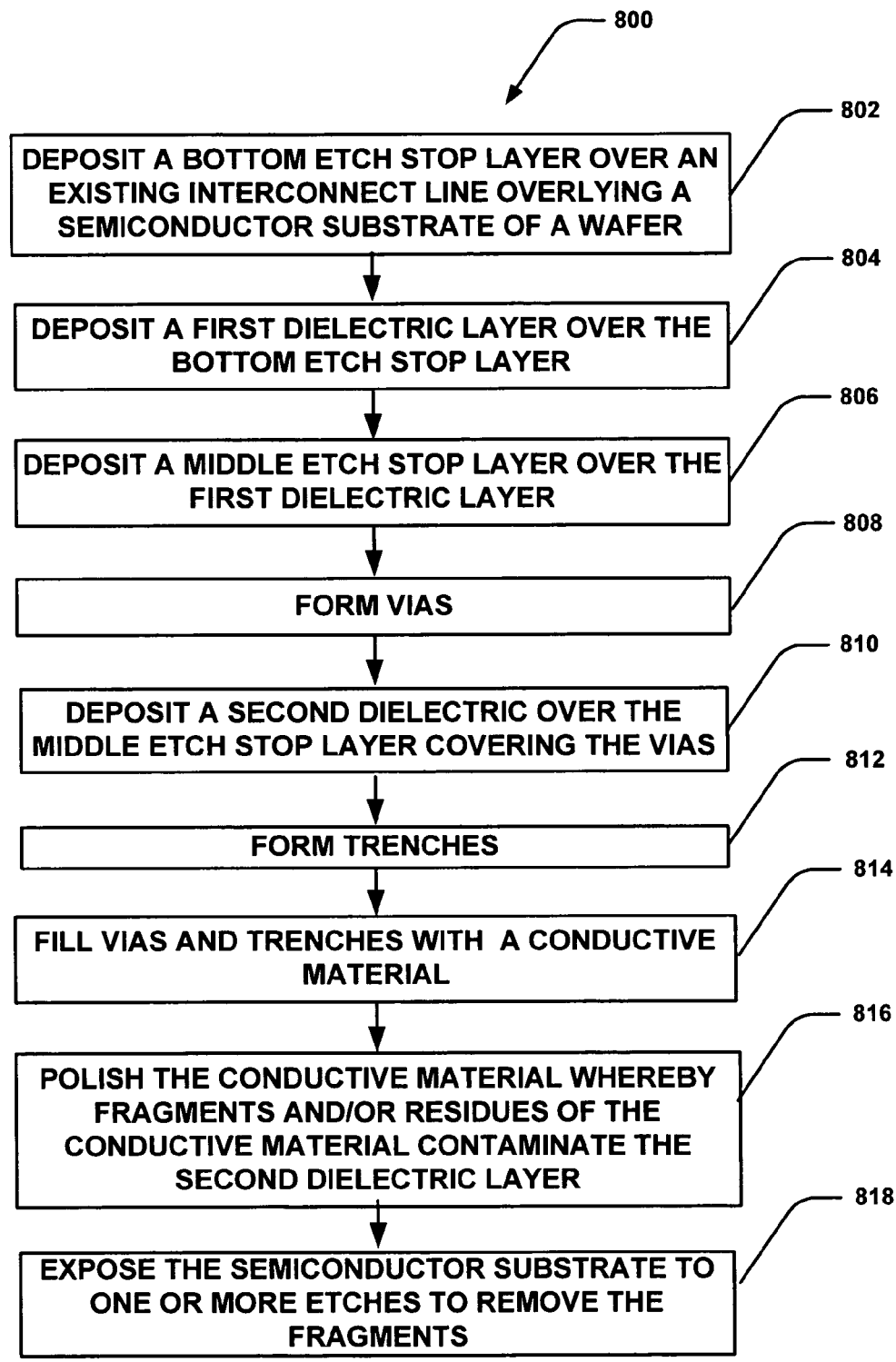
FIG. 8 is a flow chart of an exemplary methodology 800 for eliminating and/or mitigating bridging and/or leakage between adjacent features of a dual damascene structure according to one aspect of the subject invention.

FIG. 8 illustrates an exemplary method 800 for fabricating a dual damascene interconnect structure according to one aspect of the subject invention. The method 800 involves forming a bottom etch stop layer over an existing interconnect line overlying a semiconductor substrate (act 802), depositing a first dielectric layer over the bottom etch stop layer (act 804), depositing a middle etch stop layer over the first dielectric layer (act 806), forming vias in the first dielectric layer (act 808), depositing a second dielectric layer over the middle etch stop layer covering the vias (act 810), forming trenches over the vias (act 812), filling the trenches and vias with a conductive material (act 814), polishing the excess conductive material to planarize (act 816), and etching the surface of the dielectric layer to remove a substantial portion of the dielectric layer contaminated with fragments and/or residues of the conductive material (act 818).

Act 802 of method 800 is depositing a bottom etch stop layer over an existing interconnect line overlying a semiconductor substrate. The substrate can be similar to the substrate described for method 100 and therefore not described here. The bottom etch stop layer can be formed using any suitable material. The materials and methods of forming etch stop layers known to persons skilled in the art can be used. The material for the bottom etch stop layer can be one or more of silicon nitride, silicon oxynitride, silicon carbide, and the like. The bottom etch stop layer can be deposited to a suitable thickness using an appropriate technique. In one embodiment of the subject invention the bottom etch stop layer is formed over a metal line. The metal line can be formed of any suitable conductive material. Optionally, other layers such as barrier layers, hard mask layers, and capping layer can be formed prior to forming a first dielectric layer.

Act 804 of method 800 is forming a first dielectric layer over the bottom etch stop layer. The first dielectric layer can be formed of any dielectric material described above. The first dielectric can be silicon dioxide, silicon nitride, low k dielectrics, high k dielectrics, spin-on-glass, polymeric dielectrics. Dielectrics can be formed using suitable techniques, some of which are described above. Similarly, the dielectric layers can be formed to a suitable thickness.

Act 806 is depositing a middle etch stop layer over the first dielectric layer. The same methods and materials used to form bottom etch stop layer can be used to form middle etch stop layer with or without any modifications. Middle etch stop layer serves to protect underlying layers during formation of via openings. Optionally, other layers such as barrier layers, hard mask layers, and capping layer can be formed over the middle etch stop layer.

Act 808 of method 800 is forming of one or more of via openings. Vias can be formed in the first dielectric layer using conventional lithographic methods. Methods to form vias are well known, and therefore the details are not described here.

Act 810 is depositing a second dielectric layer over the middle etch stop layer. The same methods and materials used to form the first dielectric layer can be used to form the second dielectric layer with or without any modifications. The second dielectric can be one or more of silicon dioxide, silicon nitride, low k dielectrics, high k dielectrics, spin-on-glass, polymeric dielectrics Act 812 is forming trenches in alignment with the vias. Trenches can be formed over the vias using conventional lithographic methods. Any known method of forming of trenches can be used in the subject invention.

Optionally, a barrier layer can be formed over the surfaces of via and trench openings, and the second dielectric layer. The formation of the barrier layer is similar to the barrier layer formation described for method 100, and can be used with or without modifications.

Act 814 of method 800 is filling the vias and trenches with a conductive material. The conductive material can be any conductive metal, conductive metal alloy, conductive metal oxide, and the like. In one embodiment of the subject invention the conductive metal contains at least copper. The conductive material typically covers the openings and also the upper surface of the top dielectric layer. The conductive material layer is formed using methods and materials described for deposition of conductive material 505 of method 100.

Figure 9:
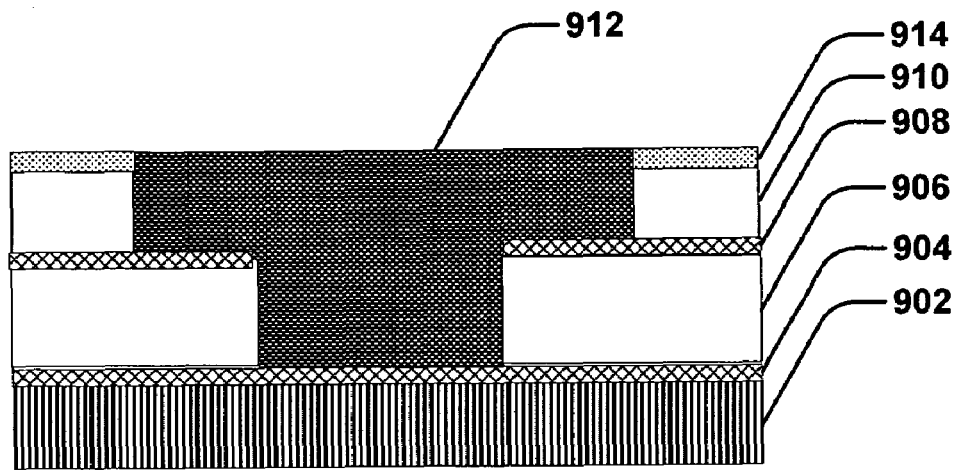
FIG. 9 is a cross sectional illustration of a dual damascene structure undergoing fabrication according to one aspect of the subject invention.

Act 816 of method 800 is polishing excess conductive material to planarize the surface such that the conductive material substantially remains only in the openings. Polishing described above for method 100 and can be used with or without modifications, and therefore not repeated here. The polishing of the conductive material creates fragments of the conductive material which can contaminate the second dielectric layer. Additionally, the dielectric surface may also contain residues of the conductive material that have been left behind in scratches formed on dielectric surface during polishing or from incomplete polishing. FIG. 9 shows a dual damascene structure formed according to one aspect of the subject invention showing a contaminated surface 914 of the second dielectric layer 910. FIG. 9 further shows the substrate 902, the bottom etch stop layer 904, the first dielectric layer 906, the middle etch stop layer 908, and the conductive material layer 912.

Figure 10:
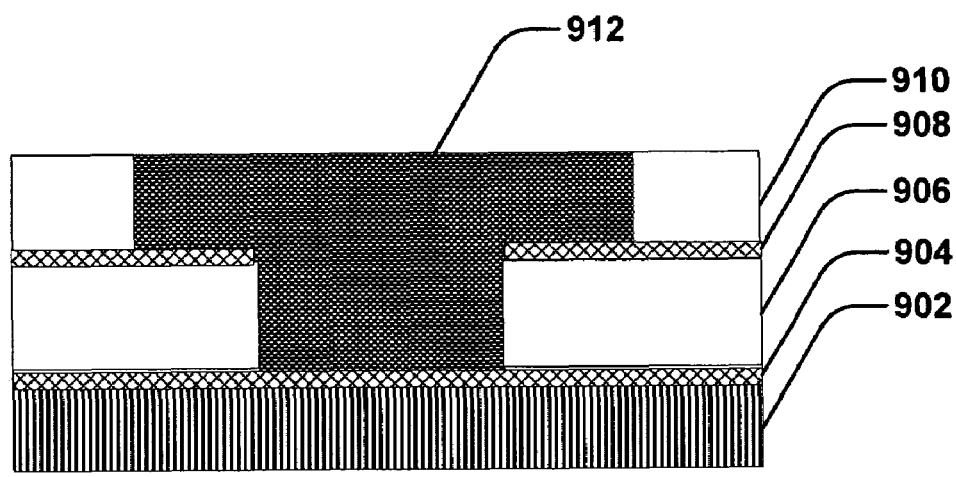
FIG. 10 is a cross sectional illustration of a dual damascene structure undergoing fabrication according to one aspect of the subject invention.

Referring back to FIG. 8, act 818 is exposing the semiconductor substrate containing a dielectric layer contaminated with fragments and/or residues of the conductive material to one or more etches to substantially remove the fragments and/or residues of the conductive material contaminating the second dielectric layer 914. Act 818 is similar to act 108 of method 100 and can be carried out with or without modifications. FIG. 10 shows a dual damascene structure after one or more etches carried out according to one aspect of the methodology 800.

The subject invention is described using one particular method of forming a dual damascene structure. However, it is to be noted that dual damascene structures can be formed in a number of ways. For example, dual damascene structures can be formed using a trench-first dual damascene approach, a via-first dual damascene approach, and a self-aligned dual-damascene approach. The subject invention can be used advantageously with dual damascene structures formed in any manner. Therefore, dual damascene structures formed with other known methods are within the scope of the subject invention. It is to be noted that the methods disclosed are equally applicable to other types of damascene structures where the vertical portion is a contact hole that reaches the semiconductor substrate or a via hole that reaches a previously formed damascene interconnect.

The subject invention by eliminating and/or mitigating the problem of bridging and/or leakage between adjacent features facilitates formation of more efficient interconnects. The methods described in the subject invention can be useful for any semiconductor device requiring metallization patterns and interconnects. The subject invention can be useful in the manufacture of computers, appliances, industrial equipment, hand-held devices, telecommunications equipment, medical equipment, research and development equipment, transportation vehicles, radar/satellite devices, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for mitigating one or more of bridging and leakage between adjacent features of a semiconductor structure, comprising:

forming openings in a dielectric layer formed over a semiconductor substrate;

depositing a conductive material over the semiconductive substrate and into the openings;

polishing the conductive material whereby at least one of fragments and residues of the conductive material contaminate the dielectric layer;

oxidizing the contaminated dielectric layer; and exposing the semiconductor substrate to a dielectric etch to achieve selective removal of the contamination portion of the dielectric layer and to a conductive etch to achieve selective removal of the at least one of fragments and residues of conductive material without significantly removing the conductive material in the openings, wherein the dielectric etch mitigates at least one of bridging and leakage between adjacent features.

2. The method of claim 1, wherein the dielectric layer comprises silicon dioxide.

3. The method of claim 1, wherein the dielectric etches comprise oxide etches.

4. The method of claim 1, wherein etching is carried out for a time period from about 1 second to about 200 seconds.

5. The method of claim 1, wherein etching is carried out for a time period from about 10 seconds to about 100 seconds.

6. The method of claim 1, wherein the dielectric etch substantially removes only the contaminated portion of a dielectric layer without significantly removing either the uncontaminated portion of the dielectric layer or conductive materials.

7. The method of claim 1, wherein the one or more etches comprise at least one of a plasma etch and a reactive ion etch.

8. The method of 1, wherein the openings comprise at least one of vias, holes, contacts, metal lines, and trenches.

9. The method of claim 1, wherein the conductive material comprises at least one selected from the group consisting of aluminum, chromium, copper, germanium, gold, magnesium, manganese, indium, iron, nickel, palladium, platinum, silver, titanium, zinc, tungsten, and alloys thereof.

10. The method of claim 1, wherein polishing the conductive material comprises a chemical mechanical polishing.

11. The method of claim 1, further comprising forming a barrier layer surrounding bottom and sidewalls of the openings.

12. A method for mitigating one or more of bridging and leakage between adjacent features in a damascene interconnect structure, comprising:

forming openings in a dielectric layer formed over a semiconductor substrate;

depositing a conductive material over the semiconductor substrate and into the openings;

polishing the conductive material whereby at least one of fragments and residues of the conductive material contaminate the dielectric layer;

oxidizing the contaminated dielectric layer; and exposing the semiconductor substrate to a dielectric etch to achieve selective removal of the contamination portion of the dielectric layer and to a conductive etch to achieve selective removal of the at least one of fragments and residues of conductive material without significantly removing the conductive material in the openings, wherein the dielectric etch mitigates one or more of bridging and leakage between adjacent features.

13. A method for mitigating at least one of bridging and leakage between adjacent features in a dual damascene structure, comprising:
   forming a first dielectric layer formed over a semiconductor substrate;
   depositing a middle etch stop layer over the first dielectric layer;
   forming vias in the first dielectric layer;
   forming a second dielectric layer over the middle etch stop layer covering the vias;
   forming trenches in the second dielectric layer
   depositing a conductive material into the vias and trenches;
   polishing the conductive material whereby at least one of fragments and residues of the conductive material contaminate the dielectric layer;
   oxidizing the contaminated dielectric layer; and
   exposing the semiconductor substrate to a dielectric etch to achieve selective removal of the contamination portion of the dielectric layer and to a conductive etch to achieve selective removal of the at least one of fragments and residues of conductive material without significantly removing the conductive material in the vias and trenches,
   wherein the dielectric etch mitigates one or more of bridging and leakage between adjacent features.

14. The method of claim 13, further comprising forming the first dielectric layer over a bottom etch stop layer formed over the semiconductor substrate.

15. The method of claim 13, wherein at least one of the first dielectric layer, the second dielectric layer, or a combination thereof comprises one or more selected from the group consisting of silicon dioxide, silicon nitride, low k dielectrics, high k dielectrics, spin-on-glass, and polymeric dielectrics.

16. The method of claim 13, wherein the conductive material comprises at least one selected from the group consisting of aluminum, chromium, copper, germanium, gold, magnesium, manganese, indium, iron, nickel, palladium, platinum, silver, titanium, zinc, tungsten, and alloys thereof.

17. The method of claim 13, wherein the conductive material comprises at least copper.

18. The method of claim 13, further comprising forming a barrier layer around the vias, the trenches, and upper surfaces of the second dielectric layer.

* * * * *